United States Patent [19]

Tsang et al.

[11] Patent Number: 4,707,455

[45] Date of Patent: Nov. 17, 1987

[54] METHOD OF FABRICATING A TWIN TUB CMOS DEVICE

[75] Inventors: Joseph C. Tsang, Raleigh, N.C.; Mario Ghezzo, Ballston Lake, N.Y.; Robert T. Fuller, Durham, N.C.

[73] Assignee: General Electric Company

[21] Appl. No.: 935,372

[22] Filed: Nov. 26, 1986

[51] Int. Cl.⁴ .......................................... H01L 21/425
[52] U.S. Cl. .......................................... 437/57; 437/63
[58] Field of Search ............... 29/571, 576 B, 576 W, 29/578; 148/187

[56] References Cited

U.S. PATENT DOCUMENTS

| | | | |
|---|---|---|---|
| 3,821,781 | 6/1974 | Chang et al. | 148/187 X |
| 4,244,752 | 1/1981 | Henderson, Sr. et al. | 148/187 X |
| 4,411,058 | 10/1983 | Chen | 29/571 |
| 4,420,344 | 12/1983 | Davies et al. | 29/576 B X |
| 4,470,191 | 9/1984 | Cottrell et al. | 29/576 B |
| 4,480,375 | 11/1984 | Cottrell et al. | 29/576 B |
| 4,590,663 | 5/1986 | Haken | 29/571 |
| 4,599,789 | 7/1986 | Gasner | 29/571 |
| 4,600,445 | 7/1986 | Horr et al. | 29/571 X |
| 4,657,602 | 4/1987 | Henderson, Sr. | 29/571 X |

Primary Examiner—George T. Ozaki
Attorney, Agent, or Firm—Stanley C. Corwin; Birgit E. Morris

[57] ABSTRACT

A method of fabricating a semiconductor device having a symmetric and complementary P-well and N-well. The novel method involves the introduction of a first dopant type into a semiconductor substrate directly through those regions of an oxide layer and a nitride layer which do not underlie a first mask layer. The first mask layer is removed and a second mask layer is formed. A complementary dopant type is then introduced into the semiconductor substrate directly through those regions of the oxide layer and nitride layer which do not underlie the second mask layer. The second mask layer is removed and the dopant ions are simultaneously subjected to thermal drive in to thereby form adjacent wells of opposite dopant type in the semiconductor substrate.

8 Claims, 10 Drawing Figures

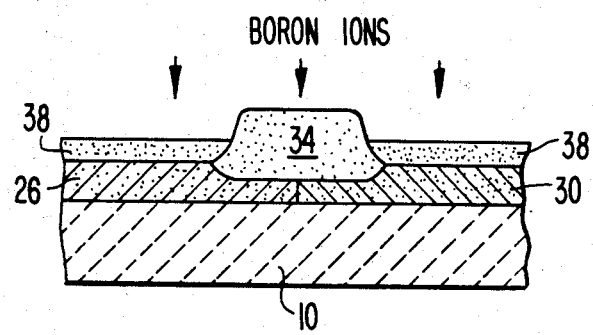
FIG. 9.
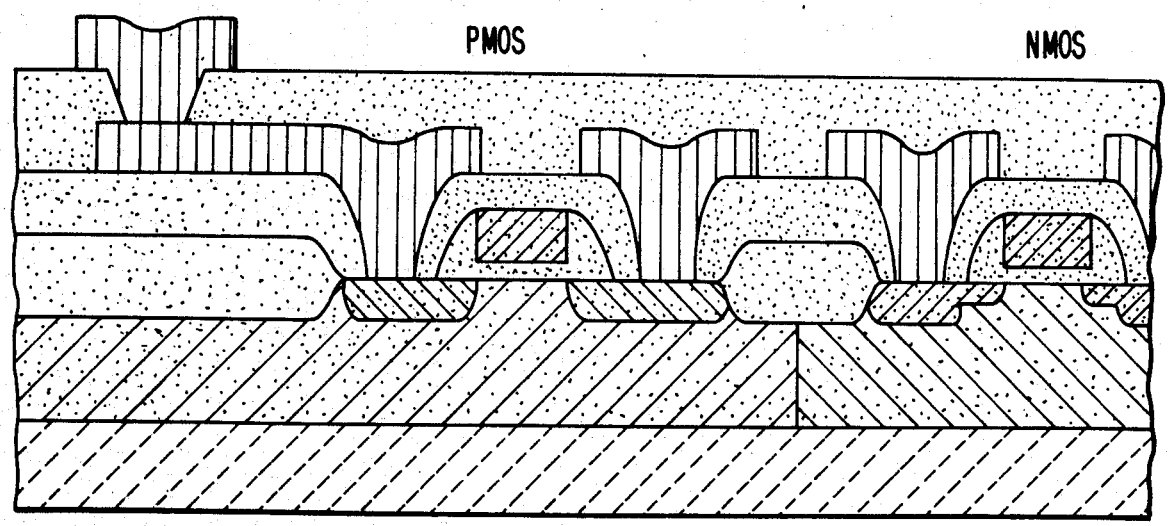
FIG. 10.
 INSULATOR (e.g. OXIDE)
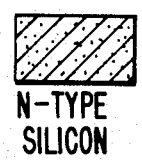 N-TYPE SILICON
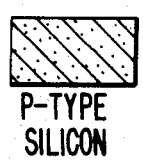 P-TYPE SILICON
 SILICON SUBSTRATE
 METAL

METHOD OF FABRICATING A TWIN TUB CMOS DEVICE

BACKGROUND OF THE INVENTION

I. Field of the Invention

The present invention relates in general to the fabrication of a semiconductor device, and more particularly to a method of fabricating twin tube or wells in a silicon substrate.

II. Description of Related Art

In the fabrication of a CMOS device it is frequently desirable to make a complementary or symmetric environment with respect to the NMOS and PMOS devices. In other words, it is frequently necessary to create a suitable N-type region for the PMOS device and a suitable P-type region for the adjacent NMOS device. Each of these N-type and P-type regions is generally referred to as a "tub" or "well".

It is known that formation of such N-wells and P-wells may be achieved by the implantation of an appropriate dopant species, such as boron or phosphorus, into a suitable substrate followed by the high temperature drive-in of the implanted ion.

The process of tub formation generally precedes the step of formation of the active area pattern. However, the step of tub formation does not leave a very clean cut marker of its presence with respect to the subsequent registration overlays, including the active area pattern. This fact necessitates the use of previous masking steps or markers to insure proper alignment. Also, in order to provide a reliable local mask during selective field oxidation, there was a need for a relatively thick nitride over the active area, which in turn prevented the penetration, during ion implant, of phosphorus or boron with adequate control. As a consequence, it is very difficult to achieve formation of twin tubs which are fully complementary and symmetrical.

A method of twin tub formation has been proposed in which oxide layers are used as masks for the various well implant steps. In this known process, an oxide-nitride sandwich is first formed on a substrate to define a first mask through which the N-tub is implanted. Over the portions of the substrate not covered by this mask, a thick oxide is grown to thereby define a second complementary mask through which the P-tub is implanted. Because the formation of these oxide mask layers occurs under high temperature, a certain amount of redistribution of the implanted ions will occur during the formation of the oxide layers used for masking. Thus, it is very difficult to obtain a symmetrical twin tub formation utilizing this process. Moreover, the Bird's beak phenomenon which occurs during formation of the second oxide mask layer provides additional problems in the formation of symmetric N-tubs and P-tubs.

Also, in a CMOS structure, there may be transistors which are in an environment or well of opposite polarity from that of the substrate. For example, the structure may include a combination of a parasitic vertical bipolar device and a parasitic lateral bipolar device of complementary or opposite type. If these devices are spaced closely together, they may enter into a state of high conduction which may be perpetuated even if the stimulus which triggered the high conduction state is removed. This condition, which is generally referred to as "latch-up", is frequently found in CMOS devices having closely adjacent bipolar devices. Such a latch-up condition may drain the power supply of the device and may also overheat the device to the point of destruction.

It is therefore an object of the present invention to provide a new and improved method of fabricating a semiconductor device which is not subject to the foregoing problems and disadvantages.

It is an additional object of the present invention to provide a method of manufacturing a semiconductor device which allows scaling of device geometry down to at least one micron.

It is another object of the present invention to provide a method of manufacturing a semiconductor device which reduces or eliminates parasitic latch-up conditions.

It is a further object of the present invention to provide a method of fabricating a semiconductor device having a high breakdown voltage, low junction capacitance and high speed performance.

SUMMARY OF THE INVENTION

In accordance with the present invention, these and other objectives are achieved by providing a wafer of semiconductor material comprising a substrate and a wafer layer thereon containing a dopant. A first oxide layer is formed on a major surface of the wafer layer, and a layer of nitride material having a first window therein is formed on the exposed surface of the oxide layer. An N-well mask, preferably of photoresist material, is formed at least atop a portion of the window to thereby define the region where N-well formation is desired. An N-type dopant is introduced into the substrate directly through those regions of the oxide and nitride layers which do not underlie the N-well mask. The N-well mask is removed and a P-well mask, again preferably of photoresist material, is formed at least atop a portion of the window to thereby define the region where P-well formation is desired. A P-type dopant is introduced into the substrate directly through those regions of the nitride and oxide layers which do not underlie the P-well mask. The P-well mask is then removed and both the N-type dopant and P-type dopant ions are simultaneously subjected to thermal drive in. A fully symmetrical and complementary P-well and N-well are thereby formed.

DESCRIPTION OF THE DRAWING

A detailed description of the invention will be made with reference to the accompanying drawings, wherein like numerals designate corresponding parts in the several figures.

FIGS. 2–9 are side-sectional views illustrating a process sequence in accordance with one embodiment of the present invention.

FIG. 10 is a side-sectional view of a semiconductor structure manufactured by a process in accordance with one embodiment of the present invention.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention. The scope of the invention is defined by the appended claims.

Figure 1:
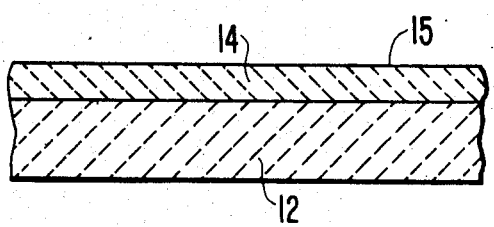
FIG. 1 is a side-sectional view of a sample starting material for a process in accordance with one embodiment of the present invention.

Referring now to FIGS. 1–10, a preferred embodiment of the present invention including a process and the resulting device will be described. As shown in FIG. 1, a wafer 10 is initially provided, preferably of silicon semiconductor material, comprising, for example, an N+ layer 12 having an N epitaxial layer 14 thereon. The N layer 14 includes a major surface 15 of the wafer 10. While the description of the preferred embodiment of the present invention is directed to a wafer having an N epitaxial layer atop an N+ layer, it is recognized that the present invention is equally applicable to silicon semiconductor wafers having other dopant types and concentrations (e.g., a P+ layer with a P epitaxial layer thereon).

In the preferred embodiment, the N+ layer 12 may comprise a commercially available material doped with antimony to a relatively high impurity concentration level of between $5 \times 10^{17}$ and $8 \times 10^{18}$ atoms per cubic centimeter and having a resistivity of less than approximately 0.025 ohm-centimeters. The N layer 14 may typically be epitaxially grown on the substrate 12, and preferably will have a thickness which may vary depending on the application for which the device is intended. In the preferred embodiment, the N layer 14 has a thickness of approximately 3 to 5 microns, with a relatively light dopant concentration of about 5E15 atoms per cubic centimeter. The provision of the relatively lightly doped epitaxial N layer 14 on top of the relatively heavily doped silicon N+ layer 12 is useful in reducing CMOS latch-up by reducing the positive feedback of the parasitic SCR (semiconductor controlled rectifier) which may be formed in the final product, as will be discussed in greater detail below.

Figure 2:
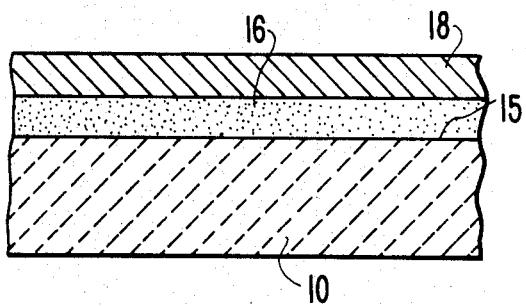

Next, an initial stress relief oxide layer 16 preferably having a thickness of about 300 Angstroms is formed on the major surface 15 of the wafer 10. A nitride layer 18 preferably having a thickness of about 800 Angstroms is then formed atop the stress relief oxide layer 16 (FIG. 2).

The relative thickness of the stress relief oxide layer 16 and the nitride layer 18 are preferably chosen so as to prevent the formation of large numbers of dislocations and damage due to stress at the edge of the nitride pattern. It has been found that such dislocations may be reduced by utilizing a nitride layer thickness which is less than approximately three times the oxide layer thickness. Thus, for an oxide layer 16 having a thickness of approximately 300 Angstroms, a nitride layer of less than approximately 900 Angstroms would be suitable for this purpose.

The combined thickness of the stress relief oxide layer 16 and the nitride layer 18 are preferably chosen so as to permit penetration by a majority (i.e., 98% to 99%) of implant ions during a subsequent high energy implantation step, which is described in further detail below.

Figure 3:
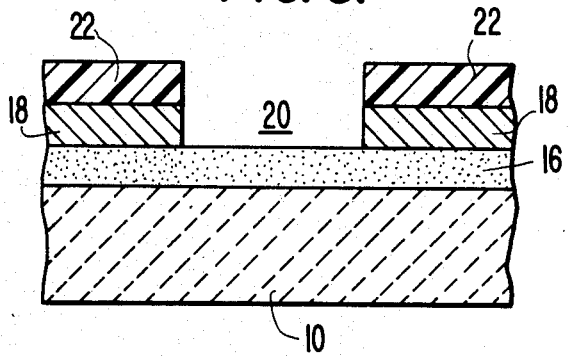

As illustrated in FIG. 3, a first window 20 is then opened in the nitride layer 18, preferably using photolithographic etching techniques. A first or "active area" photoresist 22 is used to pattern the nitride layer 18, leaving nitride over the active areas of both the active NMOS region and the active PMOS region. Thus, in the process of the present invention, the active areas of both the NMOS region and the PMOS region may be defined simultaneously prior to the formation of the twin tubs.

Figure 4:
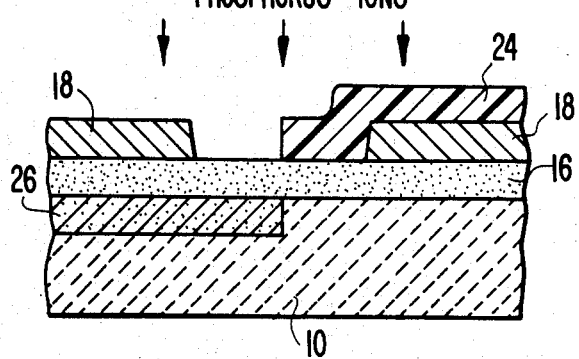

After formation of the window 20, the active area photoresist 22 is removed and a second or "N-well" photoresist 24 is deposited on top of a portion of the nitride layer 18 as well as on top of a portion of the exposed stress relief oxide layer 16 (FIG. 4). The second photoresist 24 is used to pattern the N-well 26, leaving exposed those regions of the substrate where subsequent N-well formation is desired and serving as a mask or barrier to prevent ion implantation in those regions where N-well formation is not desired. The photoresist barrier 24 utilized for defining the N-well region is typically in the form of a photosensitive polymer. This polymer material is a substantially easier material to work with as a barrier stop than, for example, the oxide layer material which has previously been used as a barrier stop in twin tub formation. As a consequence, in the present invention both the N-well region and the P-well region may be formed utilizing substantially similar procedures.

Next, as shown in FIG. 4, an N-type dopant such as phosphorus is implanted into the substrate 10 directly through those regions of the nitride layer 18 and the oxide layer 16 which are not masked by the N-well photoresist 24. The single charged phosphorus ions which are used for this implantation preferably have an energy of between approximately 200 to 260 keV, depending upon the desired junction depth. The phosphorus implantation dosage is approximately $1 \times 10^{13}/\text{cm}^2$. Since the nitride layer 18 is relatively thin (e.g., 800 Angstroms) the phosphorus ions may be implanted directly through the nitride layer without loss of adequate control over the implantation process to provide the precise amount of doping necessary for N-well formation.

Figure 5:
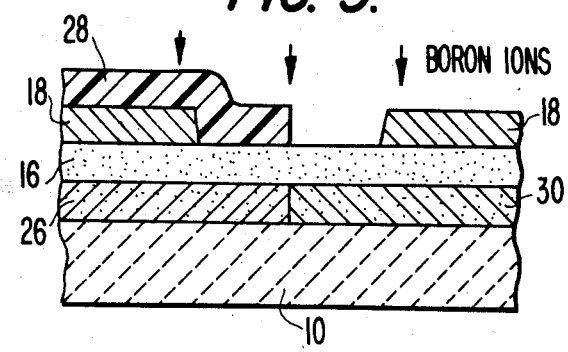

The N-well photoresist 24 is then removed and a third or "P-well" photoresist 28 is deposited on top of a portion of the nitride layer 18 as well as on top of a portion of the exposed stress relief oxide layer 16 (FIG. 5). The third photoresist 28 is used to pattern the P-well 30, leaving exposed those regions of the substrate 10 where subsequent P-well formation is desired and serving as a mask or barrier to prevent ion implantation in those regions where P-well formation is not desired. The photoresist barrier 28 utilized for defining the P-well region is typically in the form of a photosensitive polymer which, again, is a substantially easier material to work with as a barrier stop than, for example, oxide layer material.

Next, as shown in FIG. 5, a P-type dopant such as boron is implanted into the substrate 10 directly through those regions of the nitride layer 18 and the oxide layer 16 which are not masked by the P-well photoresist 28. The single charged boron ions which are used for this implantation preferably have an energy of between approximately 100 KeV and 150 KeV, depending upon the desired junction depth. The boron implant dosage is on the order of $1E13/\text{cm}^2$; i.e., roughly equivalent to the phosphorus implant dosage used for formation of the N-well. Again, because of the relative thinness of the nitride layer 18, the boron ions may be implanted directly through the nitride layer without loss of adequate control over the implantation process to provide the precise amount of doping necessary for P-well formation.

Because the N-well 26 and the P-well 30 are formed with substantially complementary doses of phosphorus and boron ions, respectively, the doses are capable of balancing each other out at the junction between the wells. The diffusivity of boron and phosphorus are substantially equivalent. Therefore, when substantially similar doses of boron and phosphorus are used for implantation, the ions penetrate into the adjoining region in substantially identical amounts. That is, the phosphorus which penetrates into the P-well 30 where the majority ion is boron is compensated for by the boron which penetrates into the N-well 26 where the majority ion is phosphorus. As a result of this simple symmetry, a nearly vertical edge of division may be achieved between the two wells. This allows the creation of wells having a thickness or depth (after drive in) of 3 to 4 microns, while at the same time having a separation on the order of 1.5 to 2 microns. In the absence of a symmetrical dosage ion implantation, nearly 3 to 4 full microns of lateral diffusion from each well (comparable to the 4 microns of depth of the well) would need to be accounted for. The present invention therefore enables a much higher density, as well as a cleaner separation, between the NMOS and the PMOS devices.

After ion implantation of the P-well 30, the P-well photoresist 28 is removed. The substrate 10 is then heated to a relatively high temperature to thereby simultaneously drive the phosphorus and boron dopant ions deeper into the substrate 10, thereby simultaneously providing deeper well profiles of both the N-well 26 and the P-well 30. In both the N-well 26 and the P-well 30 the distribution of ions tends to follow a Gaussian function.

Figure 6:
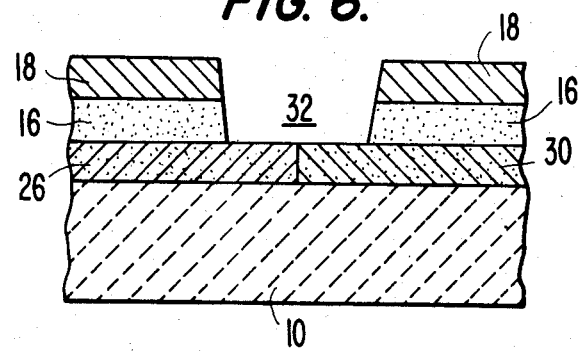

As next illustrated in FIG. 6, the exposed portion of the oxide layer 16 is selectively removed, thereby opening in the oxide layer 16 a window 32 defined by the edges of the window 20 (FIG. 3) and exposing a region of both the phosphorus doped N-well 26 and the boron doped P-well 30. Alternatively, the oxide layer 16, or at least a portion thereof, may be left in place in the window 20, since the complete removal of the oxide layer 16 is not essential to the practice of the present invention.

Figure 7:
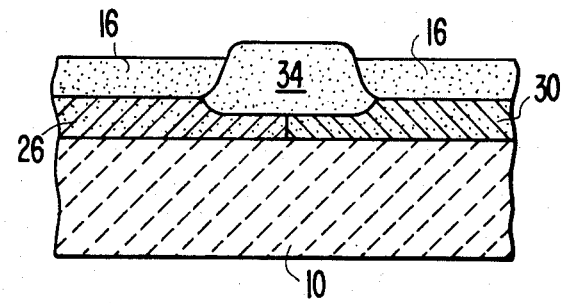

As next illustrated in FIG. 7, a field oxide layer 34 having a thickness of between approximately 5,000 Angstroms and 8,000 Angstroms is formed in the window 32. The field oxide layer 34 is preferably formed by thermal growth resulting from placing the wafer 10 in a heated furnace together with an oxidizing ambient at temperatures between approximately 1000° C. and 1100° C.

Because the nitride layer 18 is a relatively good barrier to oxygen, a significant layer of oxide will not be formed on the nitride layer 18 during the growth of the field oxide 34. The thickest growth of the field oxide layer 34 will therefore occur in the window 32 directly atop the exposed regions of the N-well 26 and the P-well 30. Oxygen will also penetrate under the nitride layer 18, resulting in the lateral growth of about 6/10 of a micron of oxide underneath the edges of nitride layer 18.

Following growth of the field oxide 34, the nitride layer 18 is completely removed, preferably by etching. To insure complete elimination of the nitride layer 18, the nitride is over-etched by approximately 30%, resulting in the removal of approximately 100 Angstroms of thickness of the oxide layer 16. The resulting product, illustrating both the field oxide 34 and the remaining oxide layer 16, is shown in FIG. 7.

Figure 8:
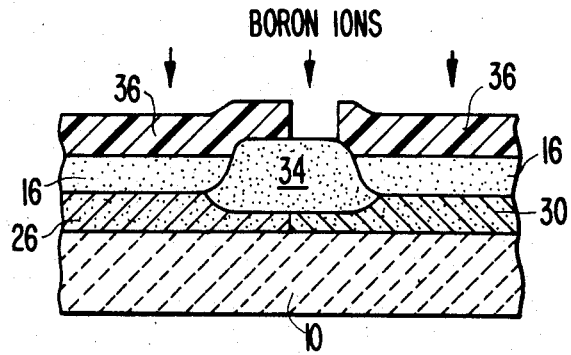

Following removal of the nitride layer 18, a channel stop photoresist 36 is deposited on top of the remaining oxide layer 16 and also on top of a portion of the field oxide 34, leaving exposed a region of the field oxide 34 which lies directly above the P-well 30 (FIG. 8). Boron ions having an energy of between approximately 200 KeV and 400 KeV are then implanted into the P-well 30 through the region of the field oxide 34 which remains exposed by the channel stop photoresist 36. This boron implant increases the concentration of boron in the NMOS field region, resulting in a higher field threshold and the prevention of isolation leakage.

After the boron implantation, the channel stop photoresist 36 is removed and the remaining oxide layer 16 is also removed.

Subsequently, a pregate oxide layer 38, preferably having a controlled thickness of between approximately 150 Angstroms and 300 Angstroms, is formed atop both the N-well 26 and the P-well 30 (FIG. 9). Formation of the pregate oxide layer 38 is useful in eliminating some of the nitride residue which may remain on the surface of the substrate 10 after removal of the stress relief oxide layer 16. The pregate oxide layer 38 may also function as an implant contamination screen, preventing contamination of the substrate 10 by a subsequent blanket boron ion implant step which is described below. Pregate oxide layer 38 may also prevent boron ion channeling in silicon by scattering the incoming ions by virtue of its amorphous structure. This insures a uniform and reproducible shallow boron profile.

With the pregate oxide layer 38 in position, the entire wafer is implanted with single-charged boron ions having an energy of between 25 KeV and 100 KeV. This blanket boron implant step is a known technique for conditioning the surface of the wafer to thereby insure the symmetry of both the NMOS and PMOS threshold voltages. Because similar amounts of correction are required for both the NMOS and PMOS devices, no masks are required.

FIG. 10 illustrates a CMOS device incorporating twin tubs formed by a process in accordance with the above-described embodiment of the present invention.

As indicated previously in the description of related art, the CMOS device may include a combination of a parasitic vertical bipolar device and a parasitic lateral bipolar device of complementary or opposite type. If these devices are spaced closely together, they may enter into a state of high conduction which may be perpetuated even if the stimulus which triggered the high conduction state is removed. This condition, which is generally referred to as "latch-up", is frequently found in CMOS devices having closely adjacent bipolar devices. Such a latch-up condition may drain the power supply of the device and may also overheat the device to the point of destruction. The latch-up problem is substantially reduced or eliminated in devices manufactured in accordance with the process of the present invention, which process helps to prevent the formation of efficient bipolar devices.

In order to produce a sustaining latch-up condition, the product of the gain of the lateral bipolar device and the adjacent vertical bipolar devices must be greater than one. The lateral bipolar devices produced in accordance with the present invention are, however, relatively inefficient, due to the high surface concentrations in both the N-well and the P-well. These devices are therefore not able to produce a very high gain. The vertical bipolar devices produced in accordance with the present invention also exhibit low gain, because the wells are relatively deep and heavily doped, so that the efficient transport of minority carriers through the base is inhibited. The N epitaxial layer 14 atop the N+ layer 12 also helps to reduce or eliminate latch-up by creating a very effective electrical shunt or parallel path of low resistance which prevents the buildup of lateral voltage below the value required to sustain a latch-up condition. The possibility of creating a latch-up condition is therefore substantially reduced or eliminated in a device produced in accordance with the present invention.

It will therefore be recognized that the present invention may be embodied in a variety of specific forms. The foregoing disclosed embodiments are therefore to be considered in all respects as illustrative and not restrictive, the scope of the invention being indicated by the appended claims, rather than the foregoing description, and all variations which come within the meaning and range of equivalency of the claim are intended to be embraced therein.

What is claimed is:

1. A method of fabricating a semiconductor device on a semiconductor substrate having a wafer layer thereon containing a dopant, said method comprising the steps of:

forming an oxide layer on a major surface of said wafer layer;

forming on the exposed surface of said oxide layer a layer of nitride material having a window exposing said oxide layer;

forming a first mask layer at least over a first portion of said window;

introducing a first type of dopant through the regions of said oxide layer and said nitride layer which do not underlie said first mask layer to thereby form a first region of predetermined depth in said wafer layer;

removing said first mask layer;

forming a second mask layer at least over a second portion of said window substantially adjacent to said first portion of said window;

introducing a second type of dopant through the regions of said oxide layer and said nitride layer which do not underlie said second mask layer to thereby form a second region of predetermined depth in said wafer layer;

removing said second mask layer; and exposing said wafer layer to a relatively elevated temperature to thereby simultaneously drive said first type of dopant and said second type of dopant deeper into said wafer layer;

whereby substantially adjacent wells of opposite dopant type are obtained in said semiconductor substrate.

2. A method as in claim 1 wherein said first mask layer and said second mask layer comprise photoresist material.

3. A method as in claim 1 further comprising the step of:

forming a second oxide layer at least over said first and second portions of said window after exposing said wafer layer to said relatively elevated temperature, said second oxide layer having a thickness greater than said first oxide layer.

4. A method as in claim 3 further comprising the step of:

forming a third mask layer at least over a portion of said second oxide layer;

introducing a boron dopant through the region of said second oxide layer which does not underlie said third mask layer to thereby form a region of relatively high boron ion concentration in said substrate adjacent said second oxide layer.

5. A method of fabricating a semiconductor device on a semiconductor substrate having a wafer layer thereon containing a dopant, said method comprising the steps of;

forming a first oxide layer on a major surface of said wafer layer;

forming on the exposed surface of said first oxide layer a layer of nitride material having a first window exposing said first oxide layer;

forming a first mask layer at least over a first portion of said first window;

introducing a first type of dopant through the regions of said oxide layer and said nitride layer which do not underlie said first mask layer to thereby form a first region of predetermined depth in said wafer layer;

removing said first mask layer;

forming a second mask layer at least over a second portion of said first window substantially adjacent to said first portion of said first window;

introducing a second type of dopant through the regions of said oxide layer and said nitride layer which do not underlie said second mask layer to thereby form a second region of predetermined depth in said wafer layer;

removing said second mask layer and at least a portion of said first oxide layer to open a second window, said second window extending between the walls of said first window to expose a portion of said major surface therebetween; and exposing said wafer layer to a relatively elevated temperature to thereby simultaneously drive said first type of dopant and said second type of dopant deeper into said wafer layer;

whereby substantially adjacent wells of opposite dopant type are obtained in said semiconductor substrate.

6. A method as in claim 5 wherein said first mask layer and said second mask layer comprise photoresist material.

7. A method as in claim 5 further comprising the step of:

forming a second oxide layer at least over said first and second portions of said window after exposing said wafer layer to said relatively elevated temperature, said second oxide layer having a thickness greater than said first oxide layer.

8. A method as in claim 5 further comprising the step of:

forming a third mask layer at least over a portion of said second oxide layer;

introducing a boron dopant through the region of said second oxide layer which does not underlie said third mask layer to thereby form a region of relatively high boron ion concentration in said substrate adjacent said second oxide layer.

* * * * *